(12) United States Patent
Warner et al.

(10) Patent No.: US 7,149,095 B2
(45) Date of Patent: Dec. 12, 2006

(54) STACKED MICROELECTRONIC ASSEMBLIES

(75) Inventors: Michael Warner, San Jose, CA (US);
Philip Damberg, Cupertino, CA (US);
John B. Riley, Dallas, TX (US); David
Gibson, Lake Oswego, OR (US);
Young-Gon Kim, Cupertino, CA (US);
Belgacem Haba, Cupertino, CA (US);
Vernon Solberg, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 211 days.

(21) Appl. No.: 10/281,550

(22) Filed: Oct. 28, 2002

(65) Prior Publication Data
US 2003/0168725 A1    Sep. 11, 2003

Related U.S. Application Data

(60) Continuation-in-part of application No. 09/776,356, filed on Feb. 2, 2001, now Pat. No. 6,699,730, which is a division of application No. 09/244,581, filed on Feb. 4, 1999, now Pat. No. 6,225,688, which is a continuation-in-part of application No. 08/987,569, filed on Dec. 11, 1997, now Pat. No. 6,121,676.

(60) Provisional application No. 60/033,353, filed on Dec. 13, 1996, provisional application No. 60/343,821, filed on Oct. 26, 2001.

(51) Int. Cl.
*H05K 1/11* (2006.01)
(52) U.S. Cl. ............... 361/803; 174/254; 174/260; 174/253; 361/767; 361/749
(58) Field of Classification Search ........ 174/254, 174/260, 253; 361/752, 803; 29/846; 257/686, 257/178
See application file for complete search history.

(56) References Cited

U.S. PATENT DOCUMENTS 3,214,827 A    11/1965    Phohofsky (Continued)

FOREIGN PATENT DOCUMENTS

EP    0 080 041 A2    6/1983

(Continued)

OTHER PUBLICATIONS

Doane, Daryl Ann and Paul D. Franzon, "Packaging Performance Factors," Multichip Module Technologies and Alternatives: The Basics, Copyright 1993 by Van Nostrand Reinhold, pp. 109-112.

(Continued)

*Primary Examiner*—Kamand Cuneo
*Assistant Examiner*—Yuriy Semenenko
(74) *Attorney, Agent, or Firm*—Lerner, David, Littenberg, Krumholz & Mentlik, LLP (57) ABSTRACT

A stacked microelectronic assembly includes a plurality of microelectronic subassemblies. Each subassembly includes a substrate having at least one site, a plurality of first contacts and a plurality of second contacts. Each subassembly also has at least one microelectronic element assembled to the at least one attachment site and electrically connected to at least some of the first and second contacts. The substrate is folded so that the first contacts are accessible at a bottom of a subassembly and the second contacts are accessible at a top of a subassembly. The plurality of subassemblies are stacked one on top of another in a generally vertical configuration. The substrate of at least one of the subassemblies has a plurality of attachment sites and a plurality of microelectronic elements assembled to the attachment sites. The substrate is folded so that at least some of the plurality of microelectronic elements are disposed alongside one another.

35 Claims, 7 Drawing Sheets

U.S. PATENT DOCUMENTS

| | | |
|---|---|---|
| 3,766,439 A | 10/1973 | Isaacson |
| 3,775,844 A | 12/1973 | Parks |
| 3,873,889 A | 3/1975 | Leyba |
| 4,225,900 A | 9/1980 | Ciccio et al. |
| 4,567,543 A | 1/1986 | Miniet |
| 4,781,601 A | 11/1988 | Kuhl |
| 4,941,033 A | 7/1990 | Kishida |
| 4,982,265 A | 1/1991 | Watanabe et al. |
| 4,991,290 A | 2/1991 | MacKay |
| 5,046,238 A | 9/1991 | Daigle et al. |
| 5,117,282 A | 5/1992 | Salatino |
| 5,138,438 A | 8/1992 | Masayuki et al. |
| 5,148,265 A | 9/1992 | Khandros et al. |
| 5,148,266 A | 9/1992 | Khandros et al. |
| 5,172,303 A | 12/1992 | Bernardoni et al. |
| 5,198,888 A | 3/1993 | Sugano et al. |
| 5,220,488 A | 6/1993 | Denes |
| 5,222,014 A | 6/1993 | Lin |
| 5,224,023 A | 6/1993 | Smith et al. |
| 5,247,423 A | 9/1993 | Lin et al. |
| 5,281,852 A | 1/1994 | Normington |
| 5,313,416 A | 5/1994 | Kimura |
| 5,334,875 A | 8/1994 | Sugano et al. |
| 5,345,205 A | 9/1994 | Kornrumpf |
| 5,347,159 A | 9/1994 | Khandros et al. |
| 5,390,844 A | 2/1995 | Distefano et al. |
| 5,394,303 A * | 2/1995 | Yamaji ........................ 361/749 |
| 5,397,916 A | 3/1995 | Normington |
| 5,398,863 A | 3/1995 | Grube et al. |
| 5,422,435 A | 6/1995 | Takiar et al. |
| 5,426,563 A | 6/1995 | Moresco et al. |
| 5,440,171 A | 8/1995 | Miyano et al. |
| 5,448,511 A | 9/1995 | Paurus et al. |
| 5,454,160 A | 10/1995 | Nickel |
| 5,455,740 A | 10/1995 | Burns |
| 5,479,318 A | 12/1995 | Burns |
| 5,489,749 A | 2/1996 | DiStefano et al. |
| 5,491,302 A | 2/1996 | Distefano et al. |
| 5,536,909 A | 7/1996 | DiStefano et al. |
| 5,552,963 A | 9/1996 | Burns |
| 5,646,446 A | 7/1997 | Nicewarner, Jr. et al. |
| 5,659,952 A | 8/1997 | Kovac et al. |
| 5,717,556 A | 2/1998 | Yanagida |
| 5,739,585 A | 4/1998 | Akram et al. |
| 5,776,797 A | 7/1998 | Nicewarner, Jr. et al. |
| 5,777,386 A | 7/1998 | Higashi et al. |
| 5,789,815 A | 8/1998 | Tessier et al. |
| 5,805,422 A | 9/1998 | Otake et al. |
| 5,861,666 A | 1/1999 | Bellaar |
| 5,956,234 A | 9/1999 | Mueller |
| 6,061,245 A * | 5/2000 | Ingraham et al. ............ 361/749 |
| 6,329,594 B1 * | 12/2001 | Sturcken .................... 174/52.4 |

FOREIGN PATENT DOCUMENTS

| | | |
|---|---|---|
| FR | 2 312 172 | 4/1976 |
| WO | WO-94/03036 | 2/1994 |
| WO | WO-97/44824 | 11/1997 |
| WO | WO 97/44824 * | 11/1997 |

OTHER PUBLICATIONS

Senba, N. et al., "Application of 3-Dimensional Memory Module," ISHM 1996 Proceedings, pp. 279-284.

Chou, Bill et al., "Ultra-High-Density Interconnect Flex Substrates," High Density Interconnects, Dec. 1998, pp. 14-21.

* cited by examiner

STACKED MICROELECTRONIC ASSEMBLIES

CROSS-REFERENCE TO RELATED APPLICATIONS

This application is a continuation-in-part of application Ser. No. 09/776,356, filed Feb. 2, 2001, now U.S. Pat. No. 6,699,730, which is a divisional of application Ser. No. 09/244,581, filed Feb. 4, 1999, now U.S. Pat. No. 6,225,688, which is a continuation-in-part of application Ser. No. 08/987,569, filed Dec. 11, 1997, now U.S. Pat. No. 6,121,676, claiming benefit of Provisional Application No. 60/033,353, filed Dec. 13, 1996, the disclosures of which are all hereby incorporated by reference herein. This application also claims benefit of Provisional Application No. 60/343,821, filed Oct. 26, 2001, the disclosure of which is hereby incorporated by reference herein.

FIELD OF THE INVENTION

The present invention relates to microelectronic assemblies and, in particular, assemblies wherein a number of subassemblies are stacked one on top of another to form the microelectronic assembly.

BACKGROUND OF THE INVENTION

Certain microelectronic packages are made using a sheet-like element incorporating a dielectric layer and mounting terminals disposed on the element. Some or all of the terminals are connected to a microelectronic device which is assembled with the sheet-like element in a package. Various proposals have been advanced for stacking plural chips one above the other in a common package. One such arrangement includes a substrate having a dielectric structure substantially larger in area than the area of a single microelectronic device or chip. Several microelectronic devices are mounted to the substrate in different areas of the substrate and the substrate is folded so that the various microelectronic devices are stacked one above the other and so that the mounting terminals on the substrate are disposed at the bottom of the stack. Typically, the substrate has electrically conductive traces extending along the dielectric structure. These traces connect the microelectronic devices with one another, with the mounting terminals, or both, in the completed structure.

The substrate must be folded in precisely the right configuration so that the various microelectronic devices will be disposed in the correct locations, one above the other. The entire package could be placed in an area of a circuit board only slightly larger than the area occupied by a single microelectronic device. However, inaccuracies in folding the substrate can cause parts of the package to lie in positions different from their intended position relative to the mounting terminals. This effectively increases the overall size of the package. Neighboring components mounted to the circuit board must be located at a larger distance from the stack so as to provide clearance sufficient to accommodate this internal misalignment within the stack. Moreover, the piece-to-piece differences between individual packages caused by folding inaccuracies can complicate the task of handling and feeding the stacked packages during automated assembly operation as, for example, during mounting to the circuit panel.

It is desirable to provide further improvements in stacked microelectronic assemblies and methods of forming the same.

SUMMARY OF THE INVENTION

In one aspect of the present invention, a stacked microelectronic assembly comprises a plurality of microelectronic subassemblies. Each subassembly comprises a substrate having at least one attachment site, a plurality of first contacts, and a plurality of second contacts. At least one microelectronic element is assembled to the at least one attachment site and electrically connected to at least some of the first and second contacts. The substrate is folded so that the first contacts are accessible at a bottom of the subassembly and the second contacts are accessible at a top of the subassembly. The plurality of subassemblies are stacked one on top of another substantially vertically so that an upper subassembly is adjacent a lower subassembly. At least some of the first contacts of the upper subassembly are connected to at least some of the second contacts of the lower subassembly. The individual subassemblies may comprise one or more components having various functions and the subassemblies need not be identical to each other.

Embodiments of the invention provide assemblies having a plurality of subassemblies stacked one on top of another. Each subassembly desirably has a separate substrate, alleviating many alignment problems. A plurality of subassemblies having microelectronic elements of a certain type may be made and assembled with subassemblies of a different type so as to form a module.

Each subassembly may include more than one microelectronic element on a substrate. In certain embodiments, the substrate of at least one of the subassemblies comprises a plurality of attachment sites and a plurality of microelectronic elements is assembled to the attachment sites.

The substrate of the at least one subassembly may be folded so that at least some of said plurality of microelectronic elements are stacked in substantially vertical alignment with one another. The microelectronic elements may include a first microelectronic element and a second microelectronic element. Each of the microelectronic elements has a first side facing the attachment site to which the microelectronic element is assembled and a second side, opposite the first side. The second sides of the microelectronic elements may be adhered to one another.

The substrate may be folded so that at least some of the plurality of microelectronic elements are disposed alongside one another. In certain preferred embodiments, the plurality of microelectronic elements comprises a plurality of memory chips. In certain preferred embodiments, the at least one microelectronic element comprises an application scale integrated circuit.

In certain embodiments, the assembly includes a passive electronic component. For example, the passive electronic component may be electrically connected with at least some of the first contacts and/or the second contacts. The passive electronic component may be interposed between a first subassembly of the plurality of subassemblies and a second subassembly of the plurality of subassemblies. The passive electronic component may be electrically interconnected with at least some of the first contacts of the first subassembly and at least some of the second contacts of the second subassembly. In other embodiments, a passive component is incorporated in one of the subassemblies.

In certain preferred embodiments, the assembly comprises components performing several different functions of an electronic device. For example, the assembly may comprise an integration of substantially all of the digital functions of a wireless telecommunications device.

In certain embodiments, a first subassembly of the plurality of subassemblies comprises at least one memory chip. A second subassembly of said plurality of subassemblies may comprise a large scale integrated circuit. The subassemblies may include any electronic component or part, including digital, RF, or analog parts.

In certain embodiments, each subassembly has a plurality of leads electrically interconnected to at least some of the first and second contacts. In certain embodiments, the at least one microelectronic element has a first side with a plurality of pads exposed at the first side, and a second side opposite from the first side. For example, the first side may face away from the attachment site to which the microelectronic element is assembled and the pads may be connected to the leads by wire bonding wires. In another example, the first side may face the attachment site to which the microelectronic element is assembled and a bonding material may connect the leads and the pads.

The subassemblies desirably comprise a first subassembly having a first substrate and a second subassembly having a second substrate, the first substrate being separate from the second substrate.

The substrate of at least one of the subassemblies desirably carries interengaging elements for holding the substrate in a folded arrangement.

In certain embodiments, at least one of the subassemblies has a substrate with a single fold on one side of said subassembly. In other embodiments, at least one of the subassemblies has a substrate with a first fold on one side of said subassembly and a second fold on the other side of said subassembly.

A microelectronic element may be connected to the second contacts of the top-most subassembly.

In certain embodiments, each subassembly has a plurality of leads electrically interconnected to at least some of the first and second contacts. The leads of at least one of the subassemblies desirably include leads extending between the first contacts and the attachment sites. The leads may include leads extending between two of the attachment sites. The leads may include leads extending between the second contacts and the attachment sites. The leads may also include leads extending between the first contacts and the second contacts.

The subassemblies desirably include a bottom-most subassembly and a top-most subassembly. The first contacts of the bottom-most subassembly are accessible at a bottom of the assembly and the second contacts of the top-most subassembly are accessible at a top of the subassembly.

In a further aspect of the present invention, a stacked microelectronic assembly comprises a plurality of microelectronic subassemblies. Each subassembly comprises a substrate having at least one attachment site, a first end, a second end, and a plurality of contacts. At least one microelectronic element is assembled to the at least one attachment site and electrically connected to at least some of the contacts, and the substrate is folded. The plurality of subassemblies is stacked one on top of another substantially vertically.

The subassemblies may comprise a first subassembly having a first substrate and a second subassembly having a second substrate. The first substrate is desirably separate from said second substrate.

The first end and second end of the substrate, in certain embodiments, are disposed at an upwardly facing side of the subassembly. In other embodiments, the first end and second end are disposed at a lateral side of the subassembly.

BRIEF DESCRIPTION OF THE DRAWINGS

These and other features, aspects, and advantages of the present invention will become better understood with regard to the following description, appended claims and accompanying drawings where:

DETAILED DESCRIPTION

Figure 1:
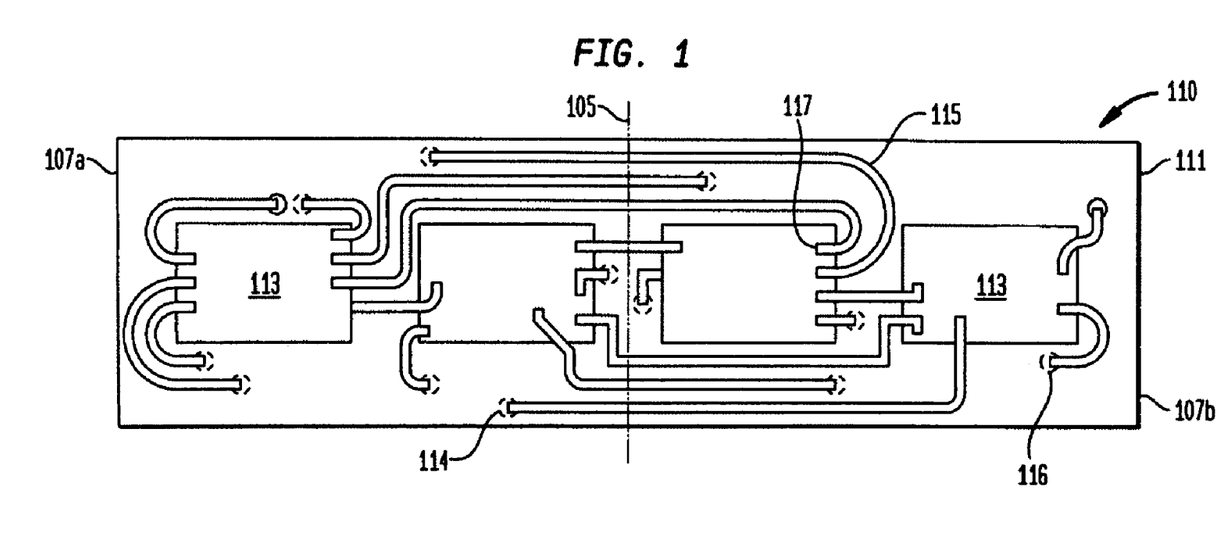
FIG. 1 is a schematic top plan view of a flexible substrate for an assembly in accordance with an embodiment of the invention.
Figure 2:
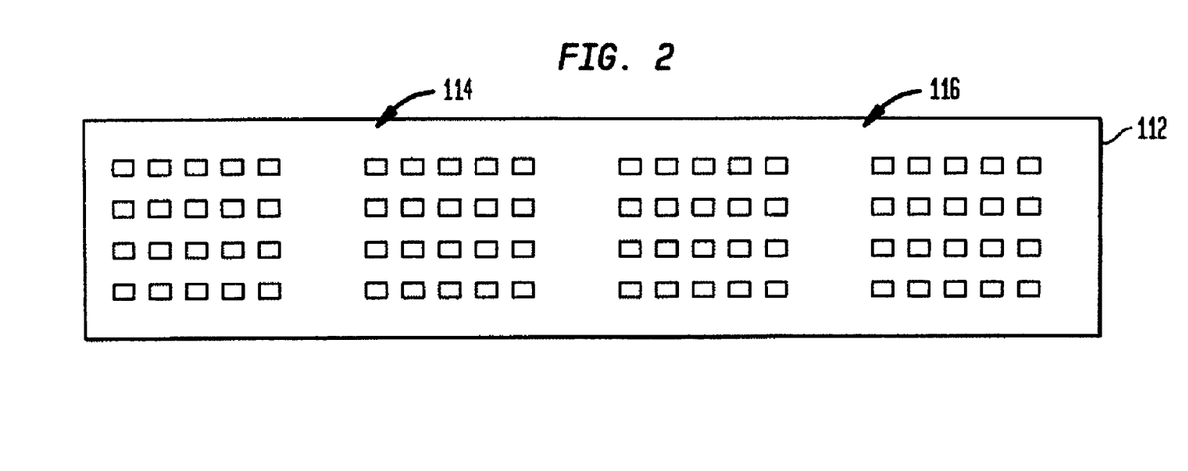
FIG. 2 is a schematic bottom second plan view of a flexible substrate for an assembly in accordance with the embodiment of FIG. 1.

An embodiment of the invention is shown in FIGS. 1–3A and 4. Substrate 110 comprises an elongated dielectric sheet having a first end 107a and a second end 107b. Substrate 110 is desirably flexible and has a plurality of attachment sites 113 on the first side 111 as best seen in FIG. 1 and first contacts 116 and second contacts 114 disposed at or near a second side 112 as best seen in FIG. 2. Substrate 110 includes a wiring layer with flexible leads 115 extending to the attachment sites 113. Through holes, vias, or other conductive members extend between the contacts to the flexible leads 115 at or near the first side 111 of the substrate 110. The flexible leads 115 have pads 117 exposed at or within the attachment sites 113. Some of the leads 115 extend between pads 117 and the first contacts 116 and some extend between pads 117 and second contacts 114. Some leads 115 extend between two pads 117 at two different attachment sites 113. Some leads extend between first contacts 116 and second contacts 114. Only a few of the leads 115 are depicted in FIG. 1 for clarity of illustration. The flexible leads 115 may be routed on the substrate 110 in a variety of ways known to those of ordinary skill in the art. The leads 115 shown in FIG. 1 are for illustration purposes and the actual configuration of the leads 115 will depend on the microelectronic element or elements to be assembled to the substrate 110. None of the drawings are to scale and various parts shown may be enlarged for clarity of illustration.

The substrate 110 may be formed from essentially any dielectric material, as for example, one or more layers of a dielectric such as polyimide, BT or flexibilized epoxy. The conductive features such as first contacts 116, second contacts 114 and flexible leads 115 may be formed from conventional metallic materials of the type commonly used in flexible circuitry, as, for example, copper, gold, alloys thereof, or combinations thereof. The techniques commonly employed to make flexible circuitry can be employed to make the substrate 110 and the metallic features thereon. These features may be formed using photolithographic techniques known in the art, by selected deposition such as plating, or by selective removal from a layer as by etching. The substrate may include additional features as, for example, one or more additional layers of leads and/or traces and electrically conductive planes such as metallic layers which can serve as a ground or power plane and which cooperate with the leads to form a controlled impedance strip line, or for other purposes.

A plurality of microelectronic elements are attached to the attachment sites 113. Each microelectronic element 101 may comprise one or more semiconductor chips, circuit panels, microelectronic components, substrates, microelectronic assemblies, stacked assemblies, passive elements, wafers, or combinations thereof. Further, any other components may be incorporated within or on the subassembly. For example, power sources (such as a battery or solar panel), displays (such as LEDs), antennas, speakers, sensors, or other parts may be incorporated within or on the subassembly.

The embodiment illustrated in FIG. 1 has four attachment sites 113 for four microelectronic elements: element 101a, element 101b, element 101c, and element 101d. The microelectronic elements each have a front face 102, a back face 104 and terminals 103 exposed at the front face 102. (See FIG. 3A). In certain embodiments, each chip is a memory chip such as a flash memory, DRAM or SRAM. Although the subassembly 100 is shown with four microelectronic elements, one or more elements may be used in a subassembly in accordance with embodiments of the invention. The microelectronic element may have the terminals distributed across the front face 102 in a two-dimensional array, one or more rows of terminals in a central location of the front face 102, adjacent the periphery of the front face 102, or in any other configuration.

Each microelectronic element 101 is joined in a flip-chip arrangement with the substrate 110. The microelectronic element 101 has a "face-down" arrangement with the front face 102 of the chip 101 confronting the first surface 111 of flexible substrate 110. Joining elements are formed between the pads 117 and the terminals 103 of the microelectronic elements 101. The joining elements 108 electrically connect at least some of the terminals 103 on the front face 102 to pads 117 of the leads 115 at the attachment sites 113.

Figure 3A:
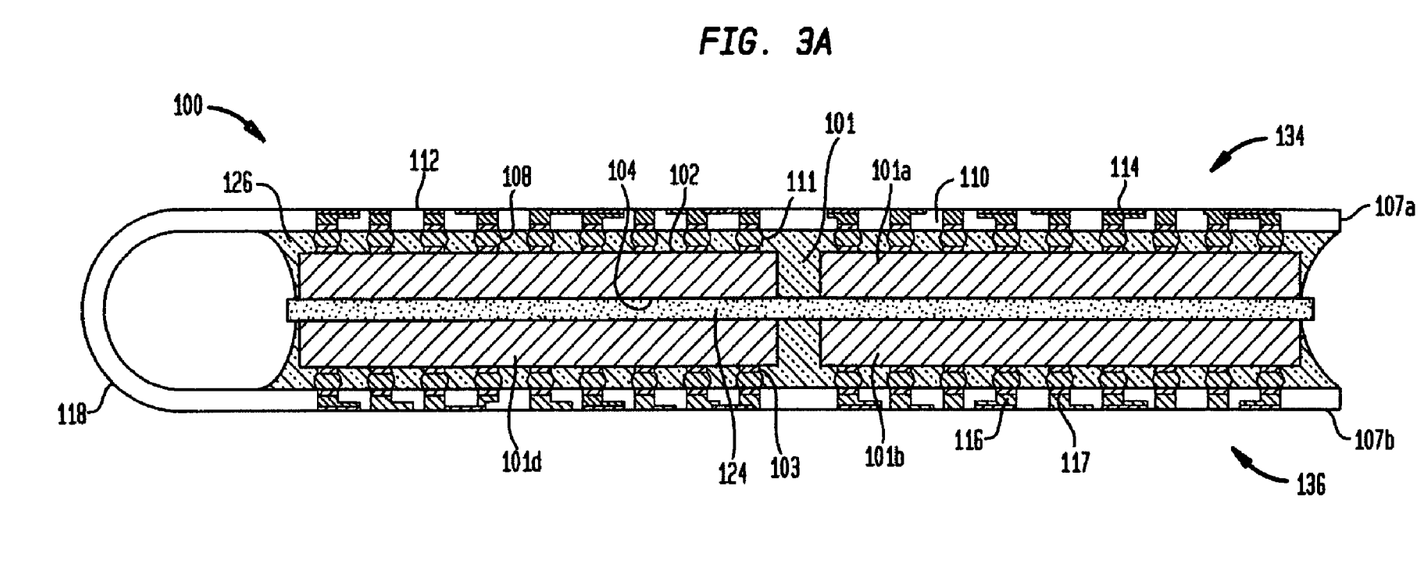
FIG. 3A is a cross-sectional view of a subassembly in accordance with the embodiment of FIGS. 1 and 2.

The joining elements 108 may comprise any electrically conductive material for forming an electrical connection between the conductive pads 117 of the leads 115 on the substrate 110 and the terminals 103 of the microelectronic elements 101. For example, as shown in FIG. 3A, the joining elements 108 may comprise a bonding material disposed between pads 117 and terminals 103. Such bonding materials include solder, conductive pastes, and conductive polymers. The joining elements 108 may comprise leads, wires or other elements, as known in the art.

Figure 3B:
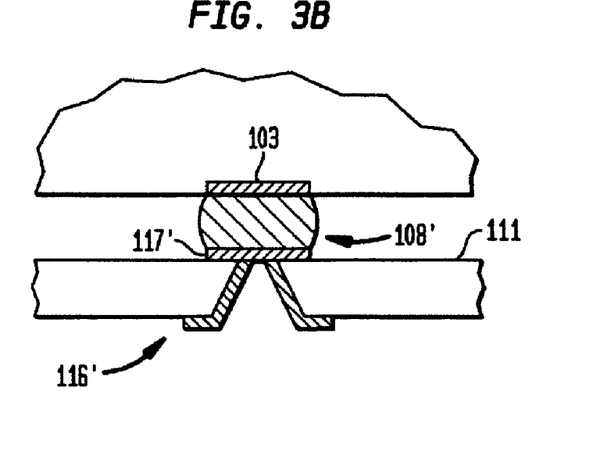
FIG. 3B is a partial cross-sectional view of a subassembly in accordance with a further embodiment of the invention.
Figure 3C:
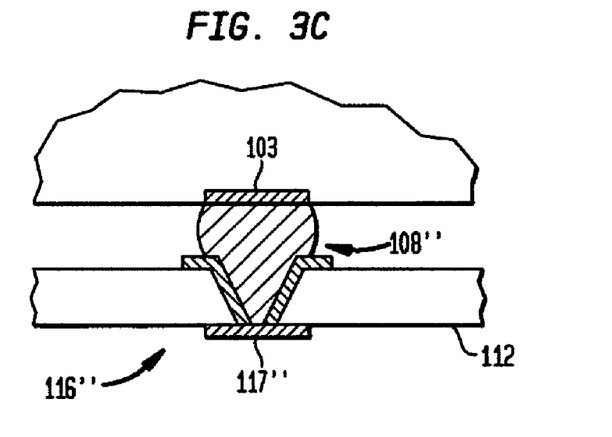
FIG. 3C is a partial cross-sectional view of a subassembly in accordance with another embodiment of the invention.
Figure 3D:
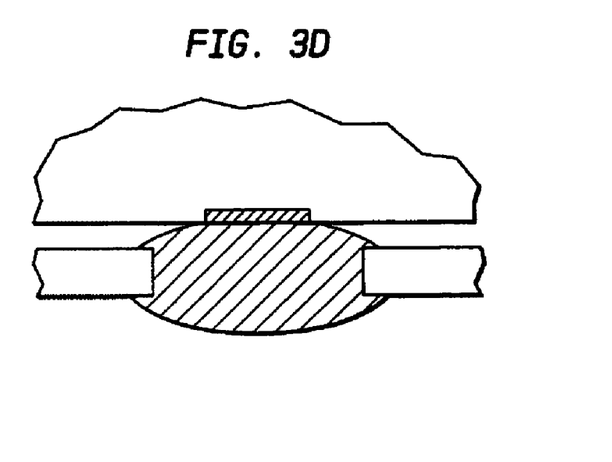
FIG. 3D is a partial cross-sectional view of a subassembly in accordance with another embodiment of the invention.

The substrate 110 shown in FIG. 3A shows joining elements 108 connected to pads 117 at first side 111 and the pads 117 are connected to the first contacts or second contacts through vias extending through the substrate 110. The vias are desirably lined or filled with an electrically conductive material, as is known in the art. Other methods for forming the first contacts and second contacts are known in the art. For example, an alternative is shown in FIG. 3B, in which a joining element 108' is disposed between terminal 103 and a pad 117' disposed at the first side 111. A via extends between the first side 111 and second side 112 of the substrate 110. The via is desirably lined or filled with electrically conductive material. The first contact 116' may be regarded as incorporating the pad 117', the via, or both, as electrical contact may be made by connecting to any of these features, which are accessible at a side of the substrate 110. FIG. 3C shows a further embodiment, in which the first contact 116" comprises a via and a pad 117" at the second side 112 of the substrate. The joining element 108" may be made to extend into the via, so as to form electrical contact with the via, the pad 117", or both. The first contact 116" may be regarded as the via, the pad 117", or both. In further embodiments, the leads 115 are omitted for at least some of the contacts and the terminals of the microelectronic element are directly connected to a pad, which is connected to the first or second contact. In other embodiments, these connections are routed on the substrate by traces or leads, such as the leads 115 shown in FIG. 1. The vias may be lined with a conductive material or unlined. FIG. 3D shows an unlined via.

An encapsulant 126 at least partially surrounds each microelectronic element, so as to encapsulate the joining elements 108 and the connection between the pads 117 and terminals 103. The encapsulant 126 comprises a dielectric material, desirably a thermosetting or thermoplastic polymer, such as an epoxy or an elastomer. A flexibilized epoxy, silicone elastomer, or other compliant or elastomeric material may be used. In other embodiments, more rigid materials are used. Encapsulant 126 desirably surrounds each microelectronic element 101. Preferably, the encapsulant 126 comprises a flowable material that is dispensed onto the first surface 111 and cured. Preferably, the extent of encapsulant 126 is limited so that it will not affect the folding of the substrate. For example, methods disclosed in certain embodiments of U.S. Pat. No. 6,225,688, the disclosure of which is hereby incorporated by reference herein, may be used. A dam may be placed in the region of the substrate 110 between the microelectronic elements 101c and 101d before the encapsulant is dispensed onto the first side 111. The dam is desirably removed before folding. Other techniques known in the art may be used.

After microelectronic elements 101 have been attached to the substrate 110 and encapsulated, the substrate 110 is folded around axis 105, so that at least some of microelectronic elements 101 assembled to the substrate 110 are stacked in vertical alignment with one another. In the embodiment shown in FIG. 3A, the microelectronic elements are grouped in pairs: element 101a is paired with element 101b; and element 101c is paired with element 101d. The substrate 110 is folded around fold axis 105 and the paired microelectronic elements are juxtaposed with one another. The back faces 104 of the paired microelectronic elements are desirably positioned close to one another. By vertically aligning at least some of the microelectronic elements in close proximity with one another, the size of the stacked assembly will be minimized. Adhesive 124 is desirably disposed on the back faces 104 of the microelectronic elements 101, adhering the microelectronic elements in a pair together.

The assembly 100 may be made utilizing certain methods disclosed in certain embodiments of U.S. Pat. Nos. 6,121,676 and 6,225,688, the disclosures of which are hereby incorporated by reference herein, as well as certain embodiments of U.S. patent application Ser. No. 09/776,356, the disclosure of which is hereby incorporated by reference herein.

A variety of methods known in the art may be used for folding the substrate 110. For example, as disclosed in certain embodiments of U.S. Pat. No. 6,225,688, the disclosure of which is hereby incorporated by reference herein, one or more spacers may be disposed on the substrate 110 at or near the portion of the substrate 110 to be folded. Such spacer or spacers assist in the folding of the substrate 110. In further embodiments of the invention, the substrate is folded according to methods disclosed in certain embodiments of provisional application No. 60/408,664, filed Sep. 6, 2002, the disclosure of which is hereby incorporated by reference herein. For example, one or more dies are utilized in folding the substrate around an axis of rotation. In addition, the subassembly 100 may include alignment elements formed on portions of the substrate 110 utilizing a mold and encapsulation or over-molding materials. The encapsulant is cured in the mold so that the alignment elements are shaped for inter-engagement, as disclosed in certain embodiments of U.S. Provisional Application No. 60/403,939, filed Aug. 16, 2002, the disclosure of which is hereby incorporated by reference herein. Upon folding the substrate, the alignment elements snap together, or engage one another in some manner.

Figure 4:
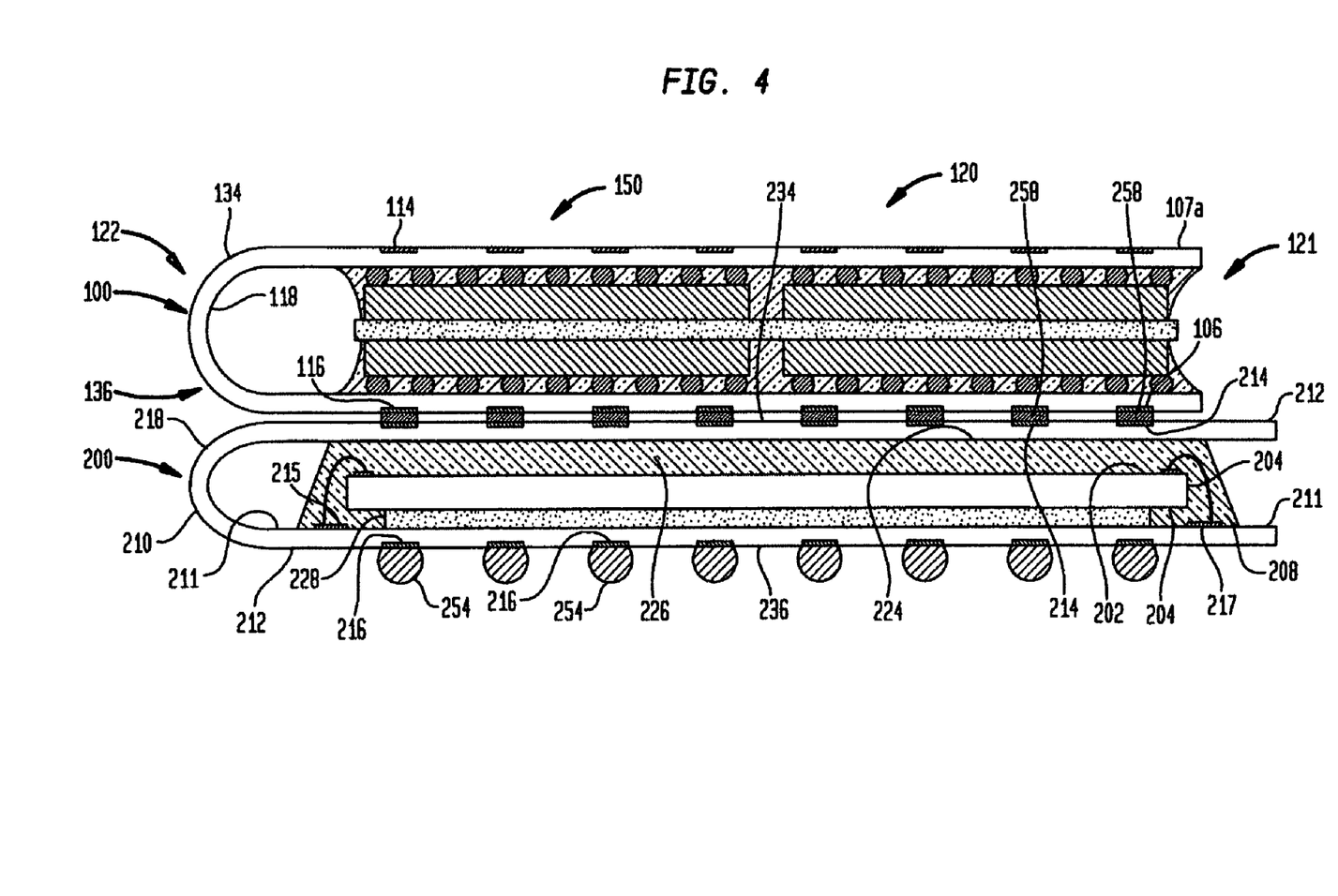
FIG. 4 is a cross-sectional view of an assembly in accordance with the embodiment of FIGS. 1–3A.

The folded subassembly, as shown in FIG. 4, provides access to second contacts 114 at the top 134 of the subassembly 100 and first contacts 116 at the bottom 136 of the subassembly 100 so that the subassembly 100 may conveniently be connected to other subassemblies or elements, such as packaged or unpackaged microelectronic elements. The subassembly 100 has an upwardly facing side 120, and two lateral sides 121, 122. In the embodiment of FIG. 4, the ends 107a and 107b of the substrate 110 are disposed at one lateral side 121 and the fold 118 is disposed at the other lateral side 122. However, other arrangements are within the scope of the present invention. Terms such as top, bottom, upwardly, or downwardly do not refer to any gravitational frame of reference and are relative to the assembly.

As illustrated in FIG. 3A, the substrate 110 may be folded to produce subassembly 100 in the shape of an elongated U comprising only one fold 118. As disclosed in commonly assigned U.S. patent application Ser. No. 09/776,356, and U.S. Pat. Nos. 6,121,676 and 6,225,688, the disclosures of which are all hereby incorporated by reference herein, other preferred embodiments may comprise flexible substrates folded in an S-shape, a zigzag configuration, a spiral, or in other configurations, and more than two microelectronic elements may be stacked vertically in the subassembly.

In embodiments that comprise paired microelectronic elements, such as chips 101a, and 101b, and/or 101c and 101d, the attachment sites 113 on the first side 111 of the flexible substrate 110 are preferably spaced so that the substrate can be folded around axis 105 and so that the back faces 104 of the paired elements 101a and 101b can be readily juxtaposed with one another during folding. In the embodiment shown in FIG. 3A, the pairs of microelectronic elements are stacked in back to back configuration. However, in other preferred embodiments, a single microelectronic element is disposed on the substrate, which is folded so as to overlie the back face 104.

A second subassembly 200, illustrated in FIG. 4, has a flexible substrate 210 with a first surface 211 and a second surface 212. The substrate comprises a dielectric material, an attachment site 213 on first surface 211, first contacts 216 and second contacts 214 disposed at or near second surface 212 and leads 115 as described above in connection with flexible substrate 110. Second subassembly 200 comprises a single microelectronic element 201. The microelectronic element 201 comprises any of the microelectronic elements discussed above. In certain preferred embodiments, microelectronic element 201 is an integrated circuit, such as a baseband/ASIC large scale integrated circuit. Microelectronic element 201 has a front face 202 with terminals 203 exposed at the front face 202 and a back face 204. Microelectronic element 201 is installed so that front face 202 faces away from the attachment site 213 on the substrate 210, in a "face-up" arrangement. The back face 204 confronts the first surface 211. In this configuration, the terminals 103 on the front face 202 are attached to the pads 217 of the leads 215 on the substrate by joining elements 108 comprising wire-bonding wires, although other methods of electrical interconnection known in the art may be used. In other preferred embodiments, microelectronic element 201 is attached in a face-down or flip-chip arrangement using attachment methods discussed above with regard to subassembly 100. Other methods known in the art may be used. Other microelectronic components may be substituted or combined with microelectronic element 201.

Microelectronic element 201 is desirably attached to the substrate 210 using adhesive 228 disposed between back face 204 and first surface 211 of substrate. Microelectronic element 201 is desirably encapsulated in an encapsulant material, as discussed above, so that the encapsulant 226 surrounds the microelectronic element 201 and joining elements 208. The encapsulant is desirably formed so as to create a surface 224 overlying the front face 202.

Flexible substrate 210 is folded to overlie front face 202. Desirably, the substrate 210 is disposed on the surface 224 of encapsulant 226. In preferred embodiments, encapsulant 226 forms a layer between front face 202 and the overlying portion of substrate 210, protecting joining elements 208. The preferred configurations of the subassembly 200 provide access to second contacts 214 at the top 234 of the subassembly and first contacts 216 at the bottom 236 of the subassembly, for connection to other elements. Flexible substrate 210 may be folded to produce a subassembly having an elongated U-shape with a single fold, as illustrated by FIG. 4, or in other configurations such as a S-shape, zigzag stack or spiral and may include one or more microelectronic elements attached to the substrate 210 in a variety of ways. In certain embodiments, a subassembly has more than one microelectronic element in a face-up arrangement with a folded substrate. Such microelectronic elements may be electrically connected with leads or other conductive part on the substrate using wire bonding wires, as discussed above.

In a preferred embodiment illustrated by FIG. 4, first contacts 116 of subassembly 100 are electrically connected to second contacts 214 of subassembly 200. For example, a bonding material 258 is disposed between contacts 116 and contacts 214. Land grid array (LGA) bonding may be used. For example, at least some of contacts 116 are electrically connected to at least some of contacts 214 by solder masses. Other methods of connecting contacts of adjacent subassemblies in a stack may be used, such as ball grid array (BGA) methods, leads, wires or other methods known in the art. Use of LGA methods reduce the overall height of the stack relative to methods such as BGA bonding. In a preferred embodiment, two subassemblies are used, and the assembly has an overall thickness of 1.2 mm or less. In the embodiment shown, subassembly 100 comprises the topmost subassembly 150 and subassembly 200 comprises the bottom-most subassembly 152 for the assembly. However, in other embodiments, more than two subassemblies are used.

In certain preferred embodiments, an assembly comprises the working components of an electronic device. For example, the assembly shown in FIG. 4 includes an integrated circuit, as well as a series of memory chips. Such multi-chip modules incorporate a number of functions required for an electronic device. In certain preferred embodiments, subassemblies include one or more microelectronic elements performing desired functions, and the subassemblies are attached to one another so as to form a partial or a complete electronic device.

The assembly is connected to external circuitry using joining units 259, such as solder balls. The joining units are disposed at the bottom surface 212 of the folded substrate 210 and are electrically interconnected to the first contacts 216. At least some units 259 are connected to at least some of the second contacts 214. Moreover, at least some of the joining units 259 are electrically interconnected with the second contacts 114 exposed on the top 134 of subassembly 100.

The present invention is not limited to the two-subassembly stack illustrated in FIG. 4. A larger number of subassemblies including folded substrates, packaged or unpackaged microelectronic elements or other parts, may be included. The stack may be comprised of subassemblies that are identical with each other, or subassemblies having different components or arrangements. Moreover, in certain preferred embodiments, microelectronic components with or without folded flexible substrates may be incorporated into the stacked assembly. For example, semiconductor chips or other microelectronic elements may be attached directly to contacts of a subassembly in a stack. Moreover, components other than folded flexible circuits may be incorporated between the subassemblies in the stack. For example, a passive component such as lithographic or film-printed circuitry could be stacked between bottom side 136 of subassembly 100 and top side 234 of subassembly 200 with the terminals 116,214 exposed on said surfaces attached to the passive circuitry. By combining folded flexible circuit subassemblies with selected active and passive components, stacked assemblies can be provided which integrate the digital functions of an OEM product into a single microelectronic package and such embodiments are contemplated by the present invention.

Figure 5:
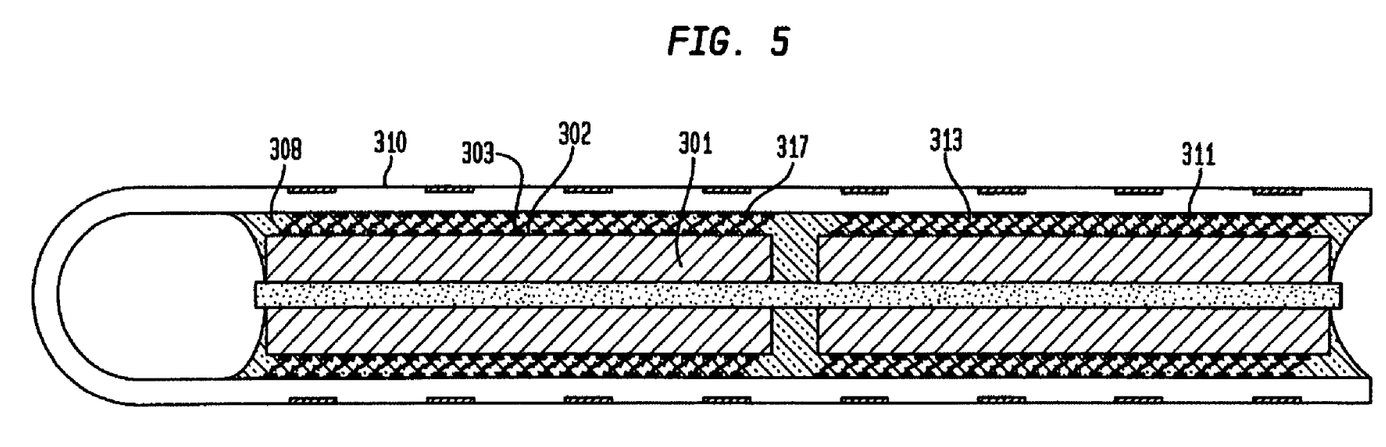
FIG. 5 is a cross-sectional view of a subassembly in accordance with a further embodiment of the invention.

In a further embodiment shown in FIG. 5, joining elements 308 are flexible leads, preferably formed of copper, gold, alloys thereof or combinations thereof. More preferably, joining elements 308 allow the pads 303 on front face 302 to move relative to the pads 317 and attachment sites 313 on first surface 311. Preferably, joining elements 308 are formed on front face 302 and bonded to the pads 317. Microelectronic element 301 and flexible substrate 310 are then displaced vertically relative to each other to form S-shaped leads. In other embodiments, the pads 303 exposed on front face 302 may be connected to the pads 317 at the attachment sites 313 by other means known in the art, such as micro-BGA techniques. Examples of preferred types of leads and methods for making the same are disclosed in commonly assigned U.S. Pat. Nos. 6,228,686; 6,191,368; 5,976,913; 5,859,472; 5,518,964; and in co-pending commonly assigned U.S. patent application Ser. No. 08/715,571.

Figure 6:
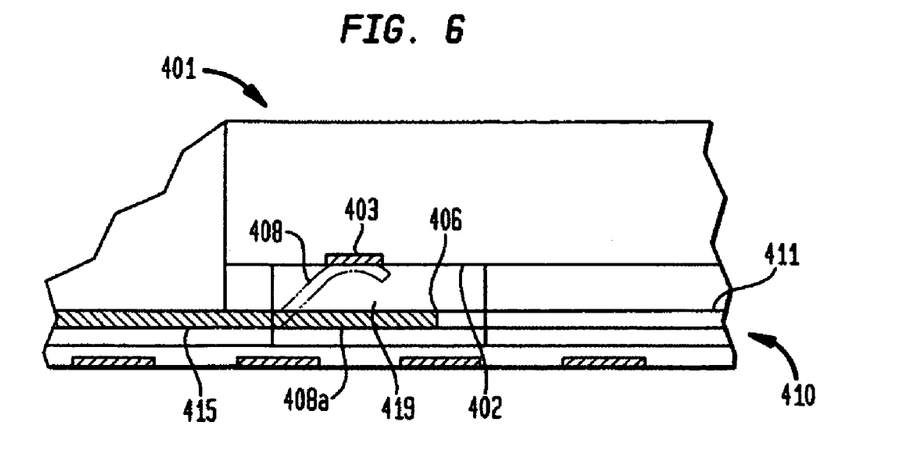
FIG. 6 is a partial cross-sectional view of a subassembly in accordance with a further embodiment of the invention.

Leads may also be formed according to the methods disclosed in commonly assigned U.S. Pat. Nos. 5,148,265; 5,148,266; 5,787,581; and 5,977,618. A lead such as that illustrated in fragmentary view of FIG. 6 may be employed to further reduce the height of the folded subassembly 100 for chips installed in a face-down configuration. In general, joining elements 408 comprise leads connected to leads 415. The joining elements 408 initially extend over slot 419 in the substrate 410. In a preferred method, joining element 408 is provided with a notch or other weakened portion therein to provide a frangible portion 406 in the joining element 408. A tool is then inserted into slot 419 to break the joining element 408 and push joining element 408, making contact with a pad 403 exposed on chip face 402.

In certain preferred embodiments, one or more of the subassemblies includes a spacer layer disposed between front face and first surface. The spacer layer is, preferably, a compliant layer. Preferred materials for such compliant layers include epoxies and silicones, with flexibilized epoxies and silicone elastomers being particularly preferred. The spacer layer may be comprised of a single padded material or, a plurality of pads.

In certain preferred embodiments, each subassembly in the stack is provided with a compliant spacer layer to absorb the stress of differential thermal expansion of the flexible substrate relative to microelectronic element and inhibit deformation of the structure during handling and installation of the subassemblies. In other preferred embodiments of the invention, only the bottom-most subassembly in a stack is provided with a compliant layer, as the effects of differential thermal expansion typically are most critical where the stack contacts external circuitry. Such compliant layers may be provided as disclosed in certain embodiments of U.S. Pat. Nos. 5,679,977; 5,148,266; and 5,148,265, the disclosures of which are hereby incorporated by reference herein.

Figure 7:
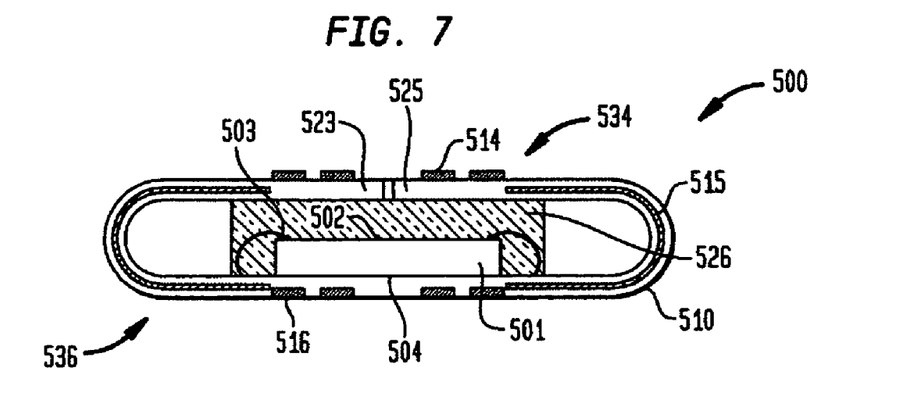
FIG. 7 is a cross-sectional view of a subassembly in accordance with another embodiment of the invention.

The subassemblies may also comprise a subassembly 500, as shown as FIG. 7. Subassembly 500 has a microelectronic element 501 with pads 503 exposed at a front face 502. The microelectronic element 501 also has a back face 504 attached to the substrate 510 so that the front face 502 faces away from the substrate 500. The substrate is folded so that a first end 523 and a second end 525 overlie the microelectronic element 501. The ends of the substrate 510 are desirably adhered to encapsulant 526 disposed over and around the microelectronic element 501. The subassembly 500 includes first contacts 516 at the bottom 536 of the subassembly and second contacts 514 disposed at the top 534 of the subassembly. The substrate 510 also has leads 515 for forming interconnections, as discussed above. Any of the subassemblies in the assembly may comprise a subassembly 500, as shown in FIG. 7.

Figure 8:
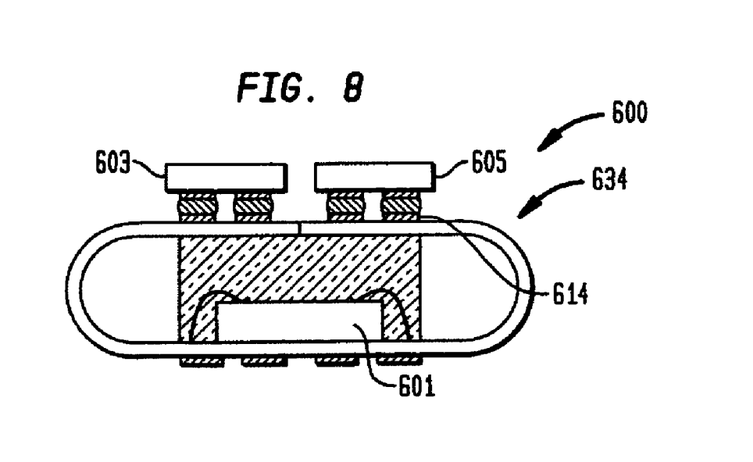
FIG. 8 is a cross-sectional view of subassembly in accordance with a further embodiment of the invention.

The subassembly 600 may also be used, in certain embodiments. Subassembly 600, as shown in FIG. 8 comprises a microelectronic element 601, which is somewhat similar to the microelectronic element 501 shown FIG. 7. Subassembly 600 also includes microelectronic elements 603 and 605 attached to the second contacts 614 at the top 634 of the subassembly. Such microelectronic elements may be connected utilizing any of the methods discussed above, or any methods known in the art. As shown in FIG. 8, a bonding material may be disposed between pads of the microelectronic elements 603 and 605 and the second contacts 614.

Figure 9A:
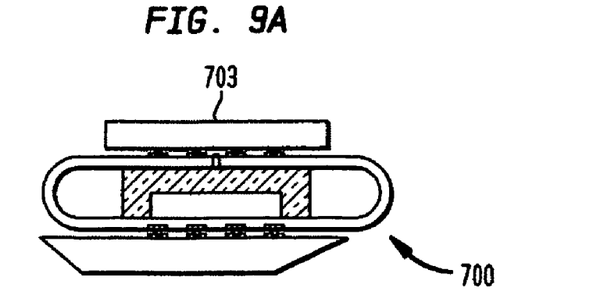
FIG. 9A is a cross-sectional view of an assembly in accordance with another embodiment of the invention.
Figure 9B:
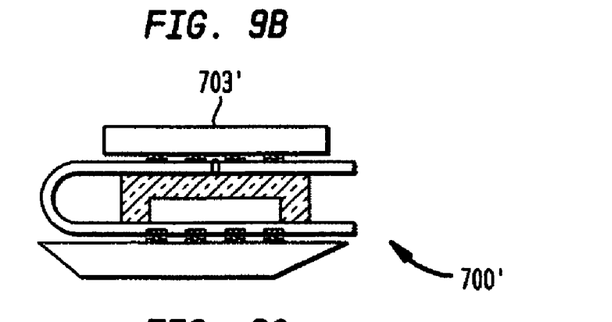
FIG. 9B is a cross-sectional view of an assembly in accordance with another embodiment of the invention.
Figure 9C:
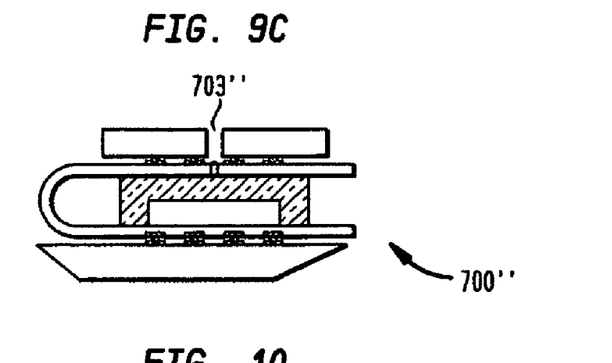
FIG. 9C is a cross-sectional view of an assembly in accordance with another embodiment of the invention.

In addition, a subassembly 700 may be attached to a single microelectronic element 703, as shown in FIG. 9A. Although the subassembly 700 shown in FIG. 9A has the ends of the substrate disposed at an upper side of the subassembly 700, the substrate may have any arrangement. For example, in FIG. 9B, a subassembly 700' is similar to the subassembly 200 shown in FIG. 4 and is assembled with a single microelectronic element 703'. One or more packaged or unpackaged microelectronic elements may be assembled with any of the subassemblies discussed above. For example, as shown in FIG. 9C, a pair of microelectronic elements 703" is connected to the subassembly 700". Thus, embodiments of the invention provide a subassembly that is incorporated into a stacked assembly. The subassembly is desirably arranged or folded so that top contacts are accessible at the top of the subassembly for connection with any packaged or unpackaged microelectronic element or other part, and bottom contacts are accessible at the bottom of the subassembly for connection to external circuitry, to form a stacked microelectronic assembly. Desirably, the substrate of the subassembly is arranged without substantially increasing the footprint of the microelectronic element, for forming a stacked assembly that conserves space on another component having external circuitry, such as a circuit board.

Figure 10:
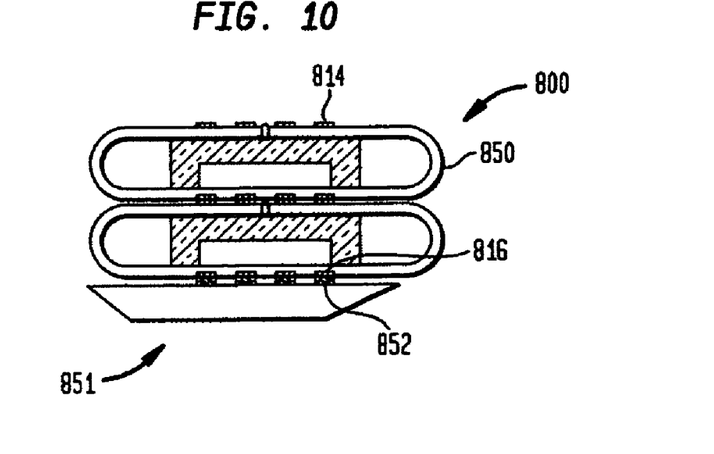
FIG. 10 is a cross-sectional view of an assembly in accordance with a further embodiment of the invention.

As shown in FIG. 10, two or more subassemblies having folded substrates may be stacked one on top of the other. The first contacts 816 are connected to an external element such as a circuit board 851 having terminals 852. The upper-most subassembly 850 has second contacts 814 for forming connections with external circuitry, including but not limited to the circuit board 851.

In further embodiments, the assembly includes microelectronic subassemblies comprising subassemblies other than those incorporating folded substrates. For example, one or more microelectronic packages or microelectronic parts are connected to the first contacts and/or second contacts of one or more subassemblies in the assembly. A microelectronic package or microelectronic part may be interposed between a subassembly having a folded substrate and either another subassembly having a folded substrate or another microelectronic package or microelectronic part. Such assembles may be mounted on a circuit board, as disclosed in certain embodiments of U.S. Provisional Application No. 60/408,644, filed Sep. 6, 2002, the disclosure of which is hereby incorporated by reference herein. Assemblies in accordance with embodiments of the present invention may be utilized in methods of operating a circuit board stuffing production plant, and/or methods of making a circuit board assembly, as disclosed in certain embodiments of U.S. Provisional Application No. 60/408,644, filed Sep. 6, 2002, the disclosure of which is hereby incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as described herein or the exemplary claims which follow.

The invention claimed is:

1. A stacked microelectronic assembly comprising:
   a) a plurality of microelectronic subassemblies, each said subassembly comprising:
      i) a substrate having at least one attachment site, a plurality of first contacts and a plurality of second contacts;
      ii) at least one microelectronic element assembled to said at least one attachment site and electrically connected to at least some of said first and second contacts, said substrate being folded so that said first contacts are accessible at a bottom of said subassembly and said second contacts are accessible at a top of said subassembly
   b) said plurality of subassemblies being stacked one on top of another substantially vertically so that an upper subassembly of said plurality of subassemblies is adjacent a lower subassembly of said plurality of subassemblies, some of the first contacts of the upper subassembly being connected to at least some of the second contacts of the lower subassembly, wherein the substrate of at least one of said subassemblies comprises a plurality of attachment sites and a plurality of microelectronic elements assembled to said attachment sites, and wherein the substrate is folded so that at least some of said plurality of microelectronic elements overlie one another, said assembly further comprising an encapsulant at least partially surrounding at least one of said microelectronic elements.

2. The assembly of claim 1, wherein said plurality of microelectronic elements comprises a plurality of memory chips.

3. The assembly of claim 1, wherein said at least one microelectronic element comprises an application scale integrated circuit.

4. The assembly of claim 1, further comprising a passive electronic component.

5. The assembly of claim 4, where said passive electronic component is electrically connected with at least some of said first contacts and said second contacts.

6. The assembly of claim 4, wherein said passive electronic component is interposed between a first subassembly of said plurality of subassemblies and a second subassembly of said plurality of subassemblies.

7. The assembly of claim 6, wherein said passive electronic component is electrically interconnected with at least some of the first contacts of said first subassembly and at least some of the second contacts of said second subassembly.

8. The assembly of claim 1, wherein said assembly comprises components performing several different functions of an electronic device.

9. The assembly of claim 1, wherein said assembly comprises an integration of substantially all of the digital functions of a wireless telecommunications device.

10. The assembly of claim 1, wherein a first subassembly of said plurality of subassemblies comprises at least one memory chip.

11. The assembly of claim 10, wherein a second subassembly of said plurality of subassemblies comprises a large scale integrated circuit.

12. The assembly of claim 1, wherein said at least one microelectronic element has a first side with a plurality of terminals exposed at the first side, and a second side opposite from the first side.

13. The assembly of claim 12, wherein said substrate of each subassembly comprises a plurality of leads connected to at least some of the first and second contacts.

14. The assembly of claim 13, wherein the first side faces away from the attachment site to which the microelectronic element is assembled and the terminals are connected to the leads by wire bonding wires.

15. The assembly of claim 13, wherein the first side faces the attachment site to which the microelectronic element is assembled and a bonding material connects the leads and the terminals.

16. The assembly of claim 1, wherein said subassemblies comprise a first subassembly having a first substrate and a second subassembly having a second substrate, the first substrate being separate from the second substrate.

17. The assembly of claim 1, wherein the substrate of at least one of said subassemblies carries interengaging elements for holding the substrate in a folded arrangement.

18. The assembly of claim 1, wherein at least one of said subassemblies has a substrate with a single fold on one side of said subassembly.

19. The assembly of claim 1, wherein at least one of said subassemblies has a substrate with a first fold on one side of said subassembly and a second fold on the other side of said subassembly.

20. The assembly of claim 1, further comprising a microelectronic element connected to the second contacts of the top-most subassembly.

21. The assembly of claim 1, wherein said substrate of each subassembly comprises leads electrically connected to at least some of the first and second contacts.

22. The assembly of claim 21, wherein the leads of at least one of said subassemblies include leads extending between the first contacts and the attachment sites.

23. The assembly of claim 21, wherein the leads include leads extending between two of the attachment sites.

24. The assembly of claim 21, wherein the leads include leads extending between the second contacts and the attachment sites.

25. The assembly of claim 21, wherein the leads include leads extending between the first contacts and the second contacts.

26. The assembly of claim 1, wherein said assembly includes a bottom-most subassembly and a top-most subassembly, the first contacts of the bottom-most subassembly being accessible at a bottom of said subassembly and the second contacts of the top-most subassembly being accessible at a top of said subassembly.

27. The assembly of claim 1, wherein said encapsulant extends between the substrate and said at least one of said microelectronic elements.

28. The assembly of claim 1, wherein said encapsulant is compliant.

29. A stacked microelectronic assembly comprising:
a) a plurality of microelectronic subassemblies, each said subassembly comprising:
  i) a substrate having at least one attachment site, a plurality of first contacts and a plurality of second contacts;
  ii) at least one microelectronic element assembled to said at least one attachment site and electrically connected to at least some of said first and second contacts, said substrate being folded so that said first contacts are accessible at a bottom of said subassembly and said second contacts are accessible at a top of said subassembly;
b) said plurality of subassemblies being stacked one on top of another substantially vertically so that an upper subassembly of said plurality of subassemblies is adjacent a lower subassembly of said plurality of subassemblies, some of the first contacts of the upper subassembly being connected to at least some of the second contacts of the lower subassembly, wherein said plurality of subassemblies includes a first subassembly having a substrate folded for stacking microelectronic elements in substantially vertical alignment with one another, and wherein said microelectronic elements include a first microelectronic element and a second microelectronic element, each of the microelectronic elements having a first side facing the attachment site to which the microelectronic element is assembled and a second side, opposite the first side, the second sides of the microelectronic elements being adhered to one another, said assembly further comprising an encapsulant at least partially surrounding at least one of said microelectronic elements.

30. The assembly of claim 29, wherein said encapsulant extends between one of said substrates and one of said microelectronic elements.

31. A stacked microelectronic assembly, comprising:
a) a plurality of microelectronic subassemblies, each said subassembly comprising:
  i) a substrate having at least one attachment site, a first end, a second end, and a plurality of contacts; and
  ii) at least one microelectronic element assembled to said at least one attachment site and electrically connected to at least some of said contacts, said substrate being folded;
b) said plurality of subassemblies being stacked one on top of another substantially vertically, wherein at least one of said subassemblies includes a plurality of microelectronic elements assembled to a plurality of attachment sites, and wherein the at least one of said substrates is folded so that at least two of said plurality of microelectronic elements overlie one another, said assembly further comprising an encapsulant at least partially surrounding one of said microelectronic elements.

32. The assembly of claim 31, wherein said subassemblies comprise a first subassembly having a first substrate and a second subassembly having a second substrate, said first substrate being separate from said second substrate.

33. The assembly of claim 31, wherein said first end and said second end of the substrate are disposed at an upwardly facing side of the subassembly.

34. The assembly of claim 31, wherein said first end and said second end are disposed at lateral sides of the subassembly.

35. The assembly of claim 31, wherein said encapsulant extends between at least one of said substrates and one of said microelectronic elements.

* * * * *